(12) United States Patent
Tailliet (10) Patent No.: US 9,099,186 B2
(45) Date of Patent: Aug. 4, 2015

(54) METHOD FOR WRITING IN AN EEPROM-TYPE MEMORY INCLUDING A MEMORY CELL REFRESH

(71) Applicant: STMicroelectronics (Rousset) SAS, Rousset (FR)

(72) Inventor: Francois Tailliet, Fuveau (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 14/293,870

(22) Filed: Jun. 2, 2014

(65) Prior Publication Data

US 2014/0355357 A1 Dec. 4, 2014

(30) Foreign Application Priority Data

Jun. 4, 2013 (FR) ...................................... 13 55110

(51) Int. Cl.
| | |
|---|---|
| G11C 16/04 | (2006.01) |
| G11C 16/02 | (2006.01) |
| G11C 16/14 | (2006.01) |
| G11C 16/10 | (2006.01) |
| G11C 16/06 | (2006.01) |
| G11C 16/24 | (2006.01) |
| G11C 16/08 | (2006.01) |
| G11C 16/16 | (2006.01) |
| G11C 11/56 | (2006.01) |

(52) U.S. Cl.
CPC ............ *G11C 16/14* (2013.01); *G11C 16/0433* (2013.01); *G11C 16/10* (2013.01); *G11C 16/16* (2013.01); *G11C 11/5628* (2013.01); *G11C 16/0483* (2013.01); *G11C 16/06* (2013.01); *G11C 16/08* (2013.01)

(58) Field of Classification Search
CPC .... G11C 16/10; G11C 16/0483; G11C 16/16; G11C 16/14; G11C 16/06; G11C 11/5628; G11C 16/08
USPC .............. 365/185.17, 185.28, 185.29, 185.23
See application file for complete search history.

(56) References Cited

U.S. PATENT DOCUMENTS

| | | |
|---|---|---|
| 5,646,890 A | 7/1997 | Lee et al. |
| 5,999,451 A | 12/1999 | Lin et al. |
| 2004/0240273 A1 | 12/2004 | Sakui |
| 2005/0185464 A1 | 8/2005 | Chih |

*Primary Examiner* — Ly D Pham
(74) *Attorney, Agent, or Firm* — Seed IP Law Group PLLC (57) ABSTRACT

The present disclosure relates to a method for writing in an EEPROM memory, the method comprising steps of: storing the bits of a word to be written in first memory units, erasing a word to be modified, formed by first memory cells connected to a word line and first bit lines, reading bits stored in the memory cells of a word line WL<i>, in a first read mode and storing the bits read in second memory units, reading in a second read mode the bits stored in the memory cells of the word line, and programming each memory cell of the word line connected to a memory unit storing a bit in the programmed state of the word to be written, of an erased word or of a word comprising a bit having different states in the first and second read modes.

16 Claims, 7 Drawing Sheets

METHOD FOR WRITING IN AN EEPROM-TYPE MEMORY INCLUDING A MEMORY CELL REFRESH

BACKGROUND

1. Technical Field

The present disclosure relates to electrically erasable programmable read only memories (EEPROM). The present disclosure relates more particularly to an erasable and programmable memory, comprising memory cells each comprising a floating-gate transistor connected in series with a MOS-type access transistor.

2. Description of the Related Art

Such a memory cell functions based on the tunnel effect (or Fowler-Nordheim effect) which involves inducing displacements of the threshold voltage of the floating-gate transistor by injecting or withdrawing charges from the floating gate through a thin oxide layer separating the floating gate from a doped region. An operation of erasing or programming a memory cell involves injecting or extracting electric charges by Fowler-Nordheim effect into or from the floating gate. The floating-gate transistor has a first threshold voltage in the programmed state and a second threshold voltage in the erased state, greater than the threshold voltage in the programmed state. When a read voltage between the threshold voltages in the programmed and erased state is applied to the control gate of the floating-gate transistor, the latter remains OFF if it is in the erased state, which corresponds by convention to a logic "0", and is ON if it is in the programmed state, which corresponds to a logic "1". It will be understood that a reverse convention can be chosen. A write cycle of writing a data word in a hardware word of an EEPROM memory classically comprises a step of erasing all the memory cells of the hardware word to be written to and a step of selectively programming the memory cells according to the state of each bit of the data word to be written.

It is desirable to produce an EEPROM memory having a low erase-granularity for example the size of a hardware word, i.e., one or more bytes. It transpires that the smaller the granularity of an EEPROM or Flash memory, the higher the footprint and the cost of such a memory becomes.

Generally, Flash memories have an erase-granularity of the size of an entire sector of several pages, typically of 4 kilobytes. Some Flash memories are designed to emulate an EEPROM memory having an erase-granularity of the size of a word. For this purpose, a RAM memory is implemented to store the data of an entire sector. A datum is written by loading the sector containing the datum to be written into the RAM memory, by writing the new value of the datum in the RAM memory, by erasing the sector, and by transferring the updated sector of the RAM memory to the Flash memory. In addition to requiring additional management and RAM memory circuits that are relatively cumbersome, this method triggers cycles of erasing and programming not only the memory cells of the datum to be updated, but also of all the other memory cells of the accessed sector. Given that a memory cell can only withstand a limited number of such cycles, typically a hundred thousand cycles, the effect of this method is to considerably reduce the service life of such a memory. Such a mechanism has also been adapted to page-erasable EEPROM memories corresponding to a line of memory cells of the memory. Adapted to EEPROM memories, this mechanism enables a few memory cells of a page to be erased, for example a single word. This adaptation also contributes to reducing the duration of use of such a memory and to increasing the footprint of the latter.

It is also desirable to be able to further miniaturize the memory cells of an EEPROM memory, and to reduce the footprint of the circuits managing the memory. For this purpose, the size of the transistors can be decreased, which involves reducing some control voltages of the memory array, resulting in risks of partially programming or erasing certain memory cells.

BRIEF SUMMARY

Some embodiments relate to a method for writing in an EEPROM memory, the method comprising steps of: the memory receiving a write command indicating the value of a datum to be written and a write address for writing in the memory, storing in first memory units the value of the datum to be written, selecting a word to be modified, formed by first memory cells belonging to a word line and a word column of the memory, corresponding to the write address, the word column comprising several first bit lines transversal to the word line and connected to the first memory cells, erasing the memory cells forming the word to be modified, storing in second memory units bits read according to a first normal read mode in second memory cells of the word line, linked to second bit lines, distinct from the first bit lines, reading in a second read mode the bits stored in the second memory cells, selecting each word stored by the second memory cells, and comprising at least one bit having different states in the first and second read modes, and programming each of the first and second memory cells belonging to a selected word and corresponding to a bit in the programmed state in the first and second memory units.

According to one embodiment, the second read mode is a mode for checking an erased state of the memory cells of the memory, the word to be modified in the memory being erased by erasing all the memory cells of the word line belonging to a selected word, and before programming the first and second memory cells.

According to one embodiment, the second read mode is a mode for checking a programmed state of the memory cells of the memory.

According to one embodiment, the method comprises steps of: reading the bits stored in the second memory cells of the word line, in a third read mode to check the erased state of the memory cells, selecting each word stored by the second memory cells, and comprising at least one bit having different states in the first and third read modes, and erasing all the memory cells of each word selected in the word line, at the same time as the word to be modified, and before programming the first and second memory cells.

According to one embodiment, the second memory cells comprise all the memory cells of the word line not belonging to the word to be modified.

According to one embodiment, each of the first, second and third read modes is implemented by applying a specific read voltage to a control gate line of the word line, the control gate line being connected to gates of floating-gate transistors of memory cells belonging to the word line, the voltages applied in the second and third read modes comprising an erase check voltage greater than the normal read voltage, and a program check voltage lower than the normal read voltage.

According to one embodiment, each of the first, second and third read modes is implemented by applying a specific read current to the bit lines connected to the memory cells to be read, the read currents applied in the second and third read modes comprising an erase check current lower than the normal read current, and a program check current greater than the normal read current.

According to one embodiment, the memory cells of each selected word of the word line are erased by subjecting the gates of floating-gate transistors of the word line to a first positive high voltage, the sources of floating-gate transistors of word columns of the memory including the memory cells to be erased to a zero voltage, and the sources of floating-gate transistors of each word column of the memory not including any memory cells to be erased to a positive inhibit low voltage.

According to one embodiment, the erase-inhibit voltage is set at an insufficient value to prevent any progressive erasing, over several erase cycles, of the memory cells in the programmed state belonging to the word line and the word column.

According to one embodiment, the memory cells of the selected words of the word line are programmed by subjecting the gates of floating-gate transistors of the word line to a second negative high voltage and the drains of the floating-gate transistors of the memory cells to be programmed to a low voltage.

According to one embodiment, the drains of the floating-gate transistors of the memory cells not to be programmed and belonging to the word line are subjected to a voltage such that the difference in potential in absolute value between the drain and the gate of the floating-gate transistors is too high to prevent any progressive programming, over several program cycles, of the memory cells in the erased state belonging to the word line and not to be programmed.

According to one embodiment, the size of the datum to be written corresponds to several words of the memory.

Some embodiments also relate to an EEPROM memory configured to implement the method defined above.

According to one embodiment, the memory comprises a memory array comprising memory cells each comprising a floating-gate transistor connected in series with a select transistor, each memory cell being connected to a bit line and belonging to a word line transversal to the bit lines, the bit lines being grouped together into word columns, each word line comprising a select line connected to a gate terminal of each of the select transistors of the word line, and a control gate line connected to a gate terminal of each of the floating-gate transistors of the word line, each word column comprising a control source line connected to a source terminal of each of the floating-gate transistors of the memory cells of the word column.

According to one embodiment, each bit line is connected to a bit line latch comprising a two-state circuit for storing the value of the datum to be written and the bits read in the first read mode.

According to one embodiment, each control source line is connected to a source line latch comprising a two-state circuit for storing the fact that a word of the word column is selected.

BRIEF DESCRIPTION OF THE SEVERAL VIEWS OF THE DRAWINGS

Some examples of embodiments of the present disclosure will be described below in relation with, but not limited to, the following figures, in which.

DETAILED DESCRIPTION

Figure 1:
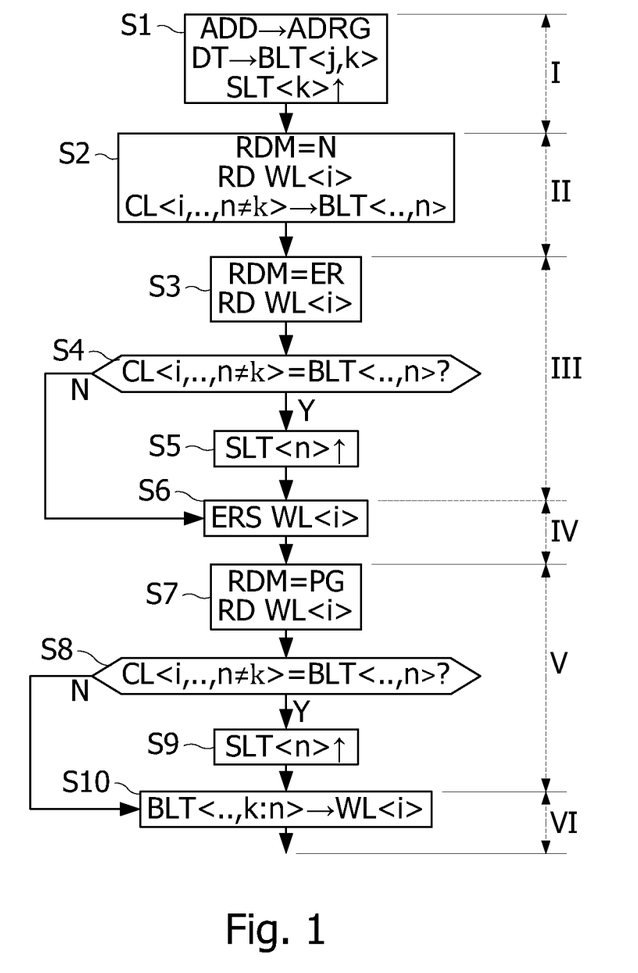
FIG. 1 represents steps executed upon receiving a write command in an EEPROM memory, according to one embodiment, FIG. 2 schematically represents circuits of a memory array in which the write processing can be implemented, according to one embodiment, FIGS. 3 and 4 schematically represent circuits of the memory array in FIG. 2, to show erase and programming operations, according to one embodiment, FIG. 5 schematically represents circuits of a memory according to one embodiment, FIG. 6 schematically represents one embodiment of a bit line latch circuit of the memory in FIG. 5, FIG. 7 schematically represents one embodiment of a column latch circuit of the memory in FIG. 5, FIGS. 8A to 8C represent timing diagrams of signals received or supplied by the column latches.

FIG. 1 represents steps S1 to S10 executed upon receiving a write command in an EEPROM memory according to one embodiment. The EEPROM memory is of the word-erasable type. A write command is received with a write address ADD in the memory and with a data word to be written DT. In a phase I corresponding to step S1, the bits of the data word to be written are loaded into bit line latches BLT<j,k> connected to bit lines linked to the memory cells that are to receive the data word to be written. Thus, in step S1, the write address ADD is loaded into an address register ADRG of the memory. This loading triggers the selection of a word line WL<i> of the memory and of a word column k transversal to the word line. The word DT is to be written in memory cells of a hardware word belonging both to the word column k and to the word line WL<i>. The bits of the word DT are loaded into the bit line latches BLT<j,k> of the selected column k. A latch SLT<k> of the column k is also put to a high state to indicate that the bits stored by the latches BLT<j,k> of the column k are desired to be transferred into the memory cells of the column k and of the line WL<i>.

In a phase II corresponding to step S2, the memory cells CL<i,j,n≠k> of the word line WL<i> and not belonging to the column k (to which the memory cells that are to receive the data word to be written belong), are read and the bits read are stored in the bit line latches BLT<j,n> linked to the read memory cells. Thus, in step S2, the memory is configured in a normal N read mode RDM. The memory cells of the word line WL<i> except for the memory cells of the column k the latch SLT<k> of which is in the high state, are read in the selected read mode and the bits thus read are transferred into the corresponding bit line latches BLT<j,n≠k> to be stored there.

According to one alternative embodiment, all the memory cells of the line WL<i> are read, but only the latches BLT<j,n≠k> of the columns n the latch SLT<n> of which is in the low state can change state to store the content of a read memory cell belonging to the word line WL<i> and to the bit line BL<j,n>.

In a phase III corresponding to steps S3 to S5, the erased state of the memory cells read in step S2 is checked, and the words of the word line WL<i> comprising poorly erased memory cells are selected to be erased, and then reprogrammed. In step S3, the memory is configured in a read mode RDM (=ER) provided to detect poorly erased memory cells. The memory cells of the word line WL<i> are read in the selected read mode. The memory cells belonging to the column k that are to receive the data word to be written may or may not be read. In step S4, the bits read in the ER mode (in step S3) are compared with the corresponding bits, stored by the latches BLT<j,n≠k> in step S2. Every time the comparison reveals a difference, a latch SLT<n> of the column n to which the read and compared bit belongs, is also put to the high state, in step S5. The bits possibly read in the column k of the word to be written may be compared, but this is not necessary. Such a comparison would indeed have no other effect than to check the change to the high state of the latch SLT<k> of the column k, already in the high state (since phase I).

In a phase IV corresponding to step S6, the memory cells that are to receive the word to be written and those selected during phase III are erased. Thus, in step S6, the memory is controlled to erase all the memory cells belonging to a word column k the column latch SLT<k>, SLT<n> of which is in the high state.

In a phase V corresponding to steps S7 to S9, the programmed state of the memory cells read in step S2 is checked, and the words of the word line WL<i> comprising poorly programmed memory cells are selected to be reprogrammed. In step S7, the memory is configured in a read mode RDM (=PG) provided to detect poorly programmed memory cells. The memory cells of the word line WL<i> are read in the read mode PG. The memory cells belonging to the previously selected columns k, n may or may not be read. In step S8, the bits read in the PG mode (in step S7) are compared with the corresponding bits, stored by the latches BLT<j,n≠k> (in step S2). Every time the comparison reveals a difference, a latch SLT<n> of the column n to which the read and compared bit belongs, is also put to the high state, in step S9. The bits possibly read in the column k of the word to be written may be compared, but this is not necessary. Such a comparison would indeed have no other effect than to check the change to the high state of the latch SLT<k> of the column k, already in the high state (since phase I or III).

In a last phase VI corresponding to step S10, all the memory cells to be programmed for the word to be written DT and those belonging to the words selected during phases III and V are programmed. In step S10, all the bits in the programmed state stored in the bit line latches BLT<j,n> belonging to columns the latch SLT<n> of which is in the high state, are transferred into the corresponding memory cells of the word line WL<i>.

A write command processed during phases I to VI includes operations of refreshing memory cells the programmed or erased state of which could be altered during the erase or programming operations done previously to write a word in other memory cells of the memory. This processing is done by erasing and by programming only the word to be written and possibly other words having an alteration, such that the number of effective erase and program cycles that the memory is capable of withstanding is only slightly impacted.

It shall be noted that several data words can be loaded into bit line latches during phase I. In this case, all the column latches of the hardware words to be loaded are put to the high state. It shall also be noted that phases I to VI can be executed within the time generally allowed to carry out a full write operation in an EEPROM memory. The processing for writing one or more words in a page (or word line) indeed comprises three reads of the page, performed in phases II, III and V. The reading of a byte in a page typically lasts 200 ns. The sequential reading, byte by byte, of a full page of 512 bytes, is thus carried out in approximately 100 µs. These three reads of the page can thus be carried out in around 300 µs, which is insignificant compared to the normal duration of a write cycle that typically lasts from 3 to 5 ms.

It shall also be noted that phases IV and V can be executed in a reverse order. However, the order in which phases IV and V are executed as presented in FIG. 1 has the advantage of enabling disturbances of the programmed state of the memory cells of the word line WL<i>, caused by the erasing of the memory cells performed during phase IV, to be immediately detected. Furthermore, the second and third reads of the word line can concern all the cells of the word line or only the memory cells not belonging to hardware words previously write-selected, in step S1 and possibly in step S5. The hardware words previously write-selected in steps S1 and S5 are indeed erased and reprogrammed in steps S6 and S10. The erased or programmed state of the memory cells of these hardware words can be tested for convenience, as such test will merely trigger the selection for steps S6 and S10 of hardware words already selected. According to one alternative embodiment, all the memory cells of the line WL<i> are read in the read modes RDM=ER and PG (phases III and V), but only the bits read in the columns not selected (the latch SLT<n> of which is in the low state) are compared with the corresponding bits, stored by the latches BLT<j,n>.

According to another alternative embodiment, all the memory cells of the line WL<i> are read in the read modes RDM=ER and PG (phases III and V), and all the read bits are compared with the corresponding bits, stored by the latches BLT<j,n>, which results in controlling the switch to the high state of latches SLT<k> already in the high state, corresponding to the columns that are to receive the words to be written, and the columns of the words that must be reprogrammed, detected during phase III.

Figure 2:
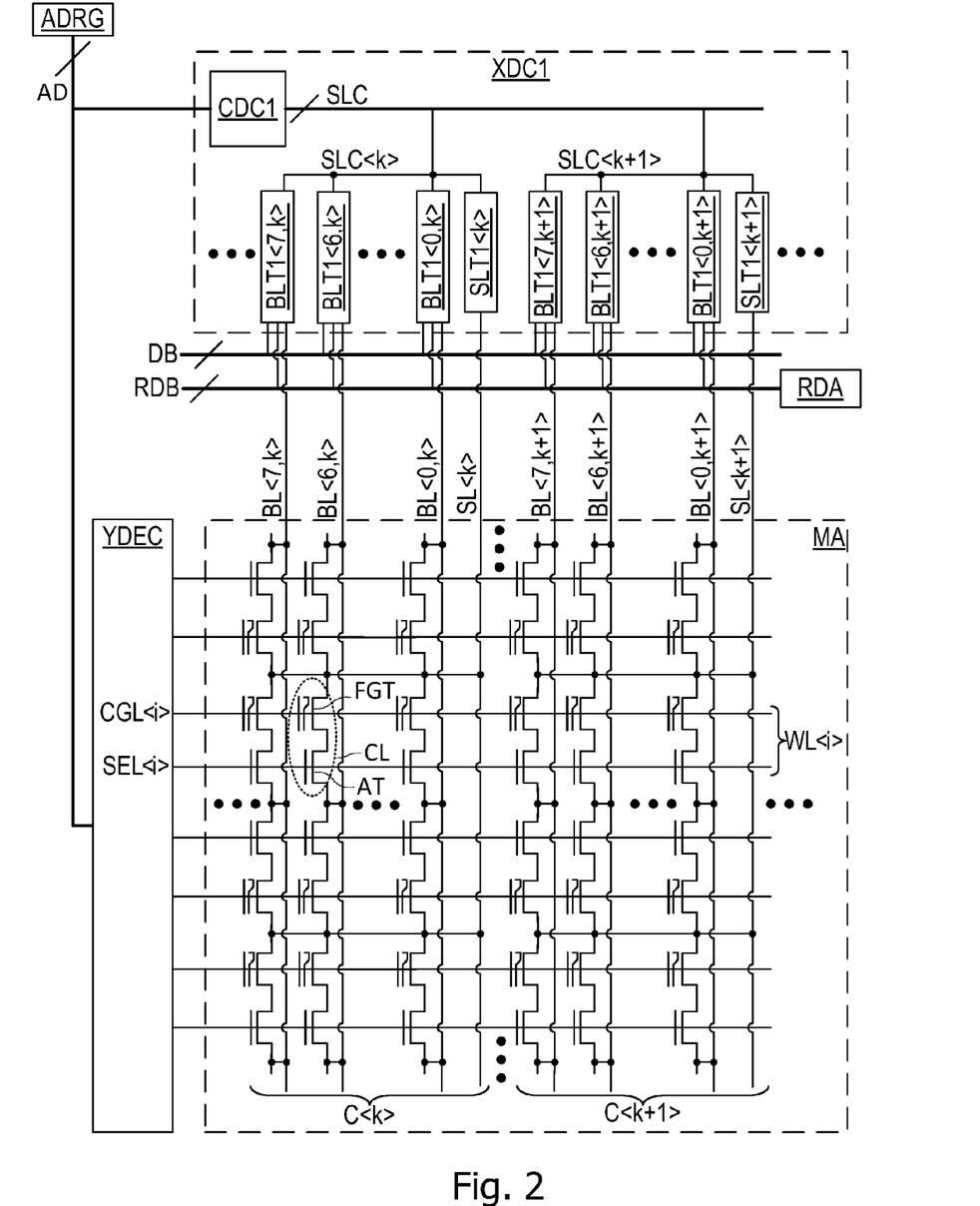

FIG. 2 represents a memory array MA and line YDEC and column XDC1 decoders of a word-erasable EEPROM memory. The memory array MA comprises memory cells CL arranged in word lines WL<i> and in bit lines BL<j,k> transversal to the word lines, several bit lines forming a word column C<k>, C<k+1>. For more clarity, only four word lines and two word columns have been represented. Each memory cell CL classically comprises a floating-gate transistor FGT in series with an access transistor AT, here of MOS type. The access transistors AT of the memory cells are linked by their drain to the bit lines BL<j,k> (j being an index ranging between 0 to 7 in the example in FIG. 2). The memory cells at the intersection of a word line and of a word column form a group of memory cells comprising M memory cells and enabling a binary word of M bits to be stored (M=8 in the example in FIG. 2).

The column decoder XDC1 comprises bit line latches BLT1<j,k> that are connected to the bit lines BL<j,k> and are controlled by column select signals SLC<k> supplied by a decoding circuit CDC1. More particularly, the bit line latches BLT1<j,k> of the bit lines BL<j,k> of a same column C<k> are controlled by the same column select signal SLC<k>. The latches BLT1<j,k> are further linked to a data bus DB of the memory, and supply in memory cell programming phase, a high programming voltage supplied for example by a charge pump. This programming voltage is supplied if the corresponding bit received via the bus DB has the logic programming value (for example the value 1), as otherwise (value 0) the targeted memory cell remains in the erased state.

The gates of the access transistors AT of the memory cells of a same word line WL<i> are linked to a common select line SEL<i>, that is controlled by the line decoder YDEC. The gates of the transistors FGT of the memory cells of a same word line WL<i> are linked to a control gate line CGL<i>, that is also controlled by the line decoder YDEC. The decoder YDEC thus comprises, for each word line WL<i>, two distinct outputs respectively controlling the select line SEL<i> and the line CGL<i>. The source lines of the transistors FGT of the memory cells of a same column C(k) are connected to a common source line SL<k>. Each source line SL<k> is controlled by a column latch SLT1<k> of the decoder XDC1, the decoder XDC1 comprising as many column latches SLT1<k> as columns C<k> to be individually selected.

Therefore, the distribution of the memory cells into columns to obtain groups of memory cells is obtained here by providing source lines SL<k> common to all the memory cells of a same column C<k>. It follows that the control line CGL<i> of a word line WL<i> can be used to control all the transistors FGT of the memory cells of the word line.

The source line latches SLT1<k> are controlled by the column select signals SLC<k> supplied by the decoding circuit CDC1, and apply different voltages to the source lines depending on whether the corresponding columns are selected or not by the circuit CDC1. Therefore, in memory cell erase phase, the source line latches SLT1<k> apply a reference voltage Vref (for example zero) to the source lines of the memory cells to be erased, and an inhibit voltage Vsinh to the source lines of the memory cells not to be erased.

The line decoder YDEC and the circuit CDC1 respectively receive the most significant bits and the least significant bits of an address circulating on an address bus AD linked to an address register ADRG. The decoder YDEC applies control signals to the lines CGL<i> and to the lines SEL<i>. The circuit CDC1 supplies the source line latches SLT1<k> and the bit line latches BLT1<j,k> with the column select signals SLC<k>. These various signals depend on the address present on the bus AD. As the latches BLT1<j,k> receive the column select signals SLC<k>, all the latches BLT1<j,k> of a same column C<k> are simultaneously activated when the corresponding column latch SLT1<k> is activated, which enables the memory cells of a same group to be simultaneously programmed. The word to be written in the memory cells of a selected group is supplied by a data bus DB comprising several transmission lines, each line being connected to all the bit line latches BLT1<j,k> of a same rank j. Furthermore, all the bit line latches BLT1<j,k> are linked to read amplifiers RDA through a read bus RDB.

For each word column C<k> and each word line WL<i>, the operations of erasing and programming the memory cells are performed using:

the bit line latches BLT1<j,k> which control the bit lines BL<j,k> of the selected column,
the decoder YDEC of word lines WL<i> which controls the control gate line CGL<i> and the select line SEL<i> of the selected word line, and
the source line latches SLT1<k>.

Figure 3:
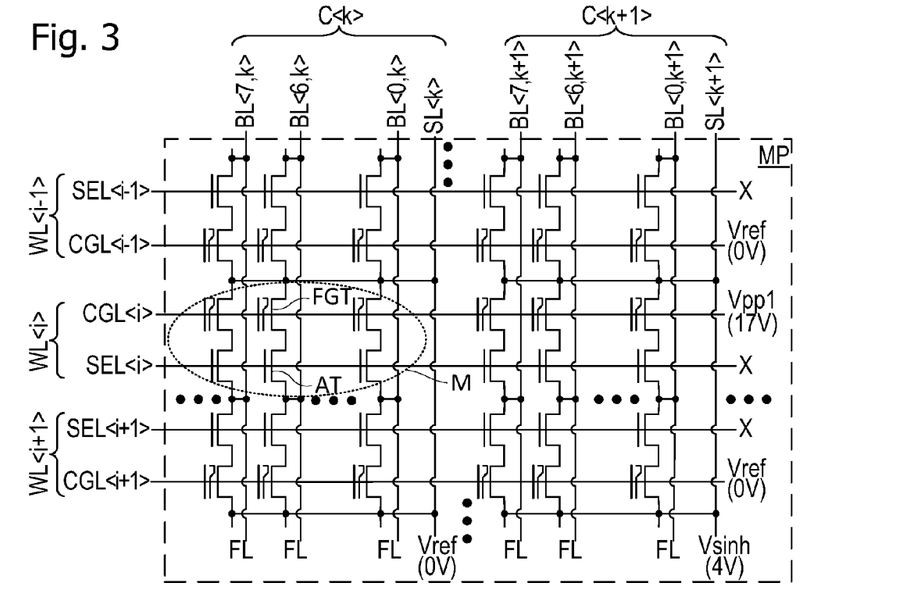

FIG. 3 represents a set of memory cells of the memory array MA and shows an operation of erasing a group M of memory cells. The memory cells of the group M in a word line WL<i> are erased by applying to the corresponding control gate line CGL<i> a positive voltage Vpp1, supplied for example by a charge pump. The voltage Vpp1 is for example between 12 and 18V (for example 17V). Simultaneously, the other control gate lines CGL<l> (with l≠i), for example the lines CGL<i−1> and CGL<i+1>, the source line SL<k> and all the select lines SEL<i> are put to a reference potential Vref, for example equal to 0 volt (linked to the ground). In addition, all the bit lines BL<j,k> are simultaneously put to a floating potential FL or high impedance, or to the potential Vref.

To only erase the memory cells of the group M (i.e., one hardware word) belonging to the column C<k> and the word line WL<i>, only the source line SL<k> of the column C<k> receives the reference voltage Vref, while all the other source lines SL<n> (with n≠k), for example the source line SL<k+1>, receive an inhibit voltage Vsinh. Therefore, the voltage drop between the control gate and the drain of the transistors FGT is equal to Vpp1−Vsinh, the voltage Vsinh being chosen sufficiently high to inhibit the erasing of the memory cells receiving this voltage.

According to one embodiment, the voltage Vsinh is chosen sufficiently low so that the select transistors AT and the transistors in the read amplifiers can be produced with a low-voltage architecture, thus with a smaller integrated circuit surface than a high-voltage architecture. Therefore, the voltage Vsinh is set to a value typically in the order of 3 to 6V. A lower inhibit voltage might not correctly inhibit the erasing, and a higher inhibit voltage might not be compatible with the leakage or breakdown constraints of the memory array MA transistors. The voltage drop between the control gate and the drain of the transistors FGT can thus reach a value too high to avoid extracting electrons by tunnel effect through the tunnel oxide layer of the floating-gate transistors FGT. The result is that a memory cell in the programmed state, not selected in the selected word line WL<i> can undergo a very slow progressive erasing which can extend over several tens, hundreds or thousands of erase cycles applied to the selected word line, before the latter is read as poorly erased during the reading in RDM=ER mode.

Figure 4:
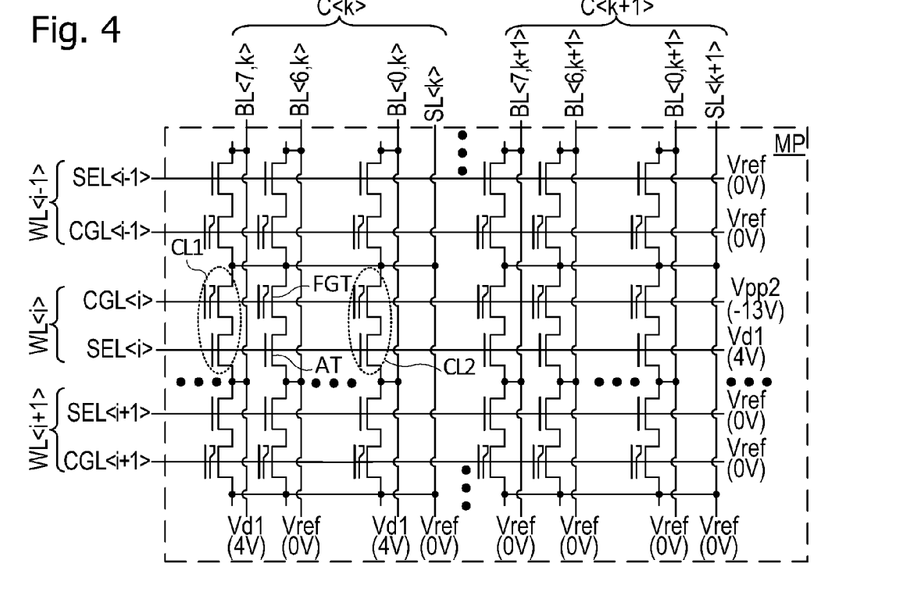

FIG. 4 shows the same set of memory cells as the one represented in FIG. 3, and shows an operation of programming memory cells CL1, CL2 belonging to the previously erased group M situated in a column C<k> and belonging to the word line WL<i>. According to one embodiment, this operation comprises the following operations:

applying a voltage Vd1 to the bit lines BL<j,k> of the memory cells CL1, CL2 to be programmed, while putting all the other bit lines to the reference potential Vref or to a floating potential,
applying the voltage Vd1 (for example equal to 5V) to the line SEL<i> of the word line WL<i>, while the select lines of the other word lines are put to the reference potential Vref,
applying a negative high voltage Vpp2 (for example equal to −10V), for example supplied by a charge pump, to the control gate line CGL<i> of the word line WL<i>, and putting all the source lines SL<k> to the voltage Vref.

The transistors FGT of the non-selected memory cells of the selected word line WL<i> thus receive on their gate the voltage Vpp2 and on their drain the voltage Vref, i.e., a programming interfering voltage equal to the difference in potential between the drain and the gate of the floating-gate transistors, i.e., Vpp2−Vref. The interfering voltage Vpp2−Vref can reach a sufficient absolute value (|Vpp2−Vref|) to inject electrons by tunnel effect through the tunnel oxide layer of the floating-gate transistors FGT. The memory cells in the erased state, not selected in the selected word line can thus undergo a very slow progressive programming over several tens, or even several hundreds or thousands of program cycles of the selected word line.

The values of the control signals during erase or programming operations, and during a read operation, are summarized in Table 1 below.

TABLE 1

| | Operation | | |
|---|---|---|---|
| Control signal | ERASING | PROGRAMMING | READING |
| SEL<i> | X | Vd1 | Vdd |
| SEL<l> (l ≠ i) | X | Vref | Vref |
| CG<i> | Vpp1 | Vpp2 | Vrd |

TABLE 1-continued

| | Operation | | |
|---|---|---|---|
| Control signal | ERASING | PROGRAMMING | READING |
| CG<1> (1 ≠ i) | Vref | Vref | Vrd |
| BL<j, k> | Floating | Vd1 | Vsns |
| BL<j, n> (n ≠ k) | Floating | Vref | X |
| SL<k> | Vref | Vref | Vref |
| SL<n> (n ≠ k) | Vsinh | Vref | Vref |

In this table, "X" means indifferent.

As an example, the voltage Vref is equal to 0V (ground), the voltages Vdd, Vd1 and Vsinh range between 3 and 6V, for example equal to 4V, the voltage Vpp1 is between 13 and 18V, for example equal to 17V, and the voltage Vpp2 is between –8 and –15V, for example equal to –13V. The voltage Vsns is in the order of 1V and the voltage Vrd is adjusted between 0 and 2V depending on the read mode RDM. The voltage Vdd can be the supply voltage of the memory. The voltage Vd1 must be regulated to a fixed value to control the tunnel current in the transistors FGT. For this purpose, the voltage Vd1 can be supplied by a charge pump of the memory.

The control voltages of the memory presented in Table 1 show that the memory cell select transistors AT only have to bear low voltages between 0 and 4V. The floating-gate transistors FGT also receive only low voltages on their drain. The size of the memory cells and the distances between the memory cells can thus be decreased, compared to memory cells that are to receive higher voltages. Such voltages enable the surface area of the memory array MA to be typically decreased by a factor 4. Furthermore, the memory array MA is word-erasable without implementing any control gate transistors for each column as is the case in a classic word-erasable EEPROM memory architecture. The removal of the control gate transistors also enables significant space to be gained due to the fact that these transistors occupy a relatively large surface area to be capable of switching high voltages.

Figure 5:
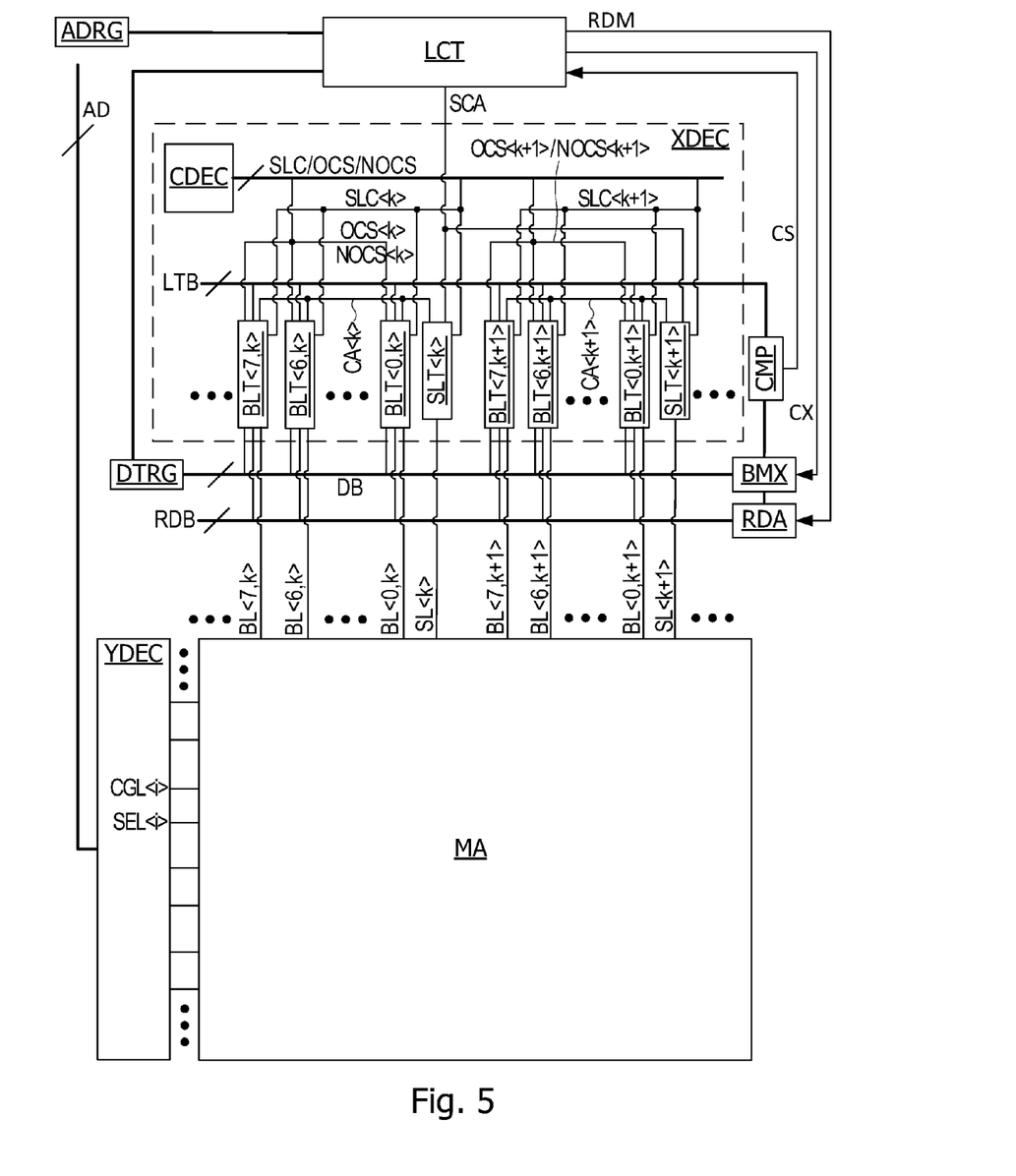

FIG. 5 represents a word-erasable EEPROM-type memory MEM, adapted according to one embodiment to be capable of implementing the write processing in FIG. 1. The memory MEM comprises the memory array MA in FIG. 2, the address register ADRG, a data register DTRG, and decoders XDEC and YDEC. The memory MEM also comprises read amplifiers RDA connected to a read bus RDB, a comparator CMP and a logic control circuit LCT. The circuit LCT can be produced using a simple finite state machine. The address register ADRG is loaded with a read or write address for reading or writing the memory by means of the circuit LCT upon receiving a read or write command. The data register DTRG is loaded with a datum to be written by the circuit LCT upon receiving a write command. Upon receiving a read command, the data register DTRG receives a read datum, supplied by the amplifiers RDA through the bus DB. The read datum appearing in the register DTRG is sent at output of the memory by the circuit LCT.

The decoder XDEC comprises bit line latches BLT<j,k> and column latches SLT<k> and a decoding circuit CDEC. The read bus RDB is connected to each of the bit line latches BLT<j,k>. The circuit LCT controls the bit line latches BLT<j,k> and the column latches SLT<k>. The circuit LCT also controls the read amplifiers RDA to select one of the read modes N, ER and PG described above. The decoding circuit CDC1 shown in FIG. 2 is replaced with the decoding circuit CDEC. The circuit CDEC supplies the latches SLT<k> and BLT<j,k> of each column k with the column select signal SLC<k>. The circuit LCT also supplies each of the source line latches SLT<k> with an activation signal SCA. The circuit CDEC also supplies the bit line latches BLT<j,k> of each column k with control signals OCS<k> and NOCS<k> according to the write processing phase in progress. Each of the latches SLT<k> supplies the latches BLT<j,k> of the same column k with a column select signal CA<k>. Each of the latches BLT<j,k> is connected to a respective line LTB<j> of rank j of an output bus LTB sending the comparator CMP the state of the latches BLT<j,k> of a column k. The comparator CMP is also connected to a bus multiplexer BMX that is connected to the data bus DB and to an output bus of the read amplifiers RDA. The multiplexer BMX is controlled by a control signal CX supplied by the circuit LCT, to send a word read by the read amplifiers RDA either to the bus DB, or to the comparator CMP, depending on the write processing phase in progress. The comparator CMP supplies the logic circuit LCT with a comparison signal CS the state of which depends on the result of the comparison of a word read in latches BLT<j,k> of a selected column k and supplied by the bus LTB, with a word read in the memory cells of the column k and of the word line WL<i> in the ER or PG mode and supplied at output of the amplifiers RDA.

Figure 6:
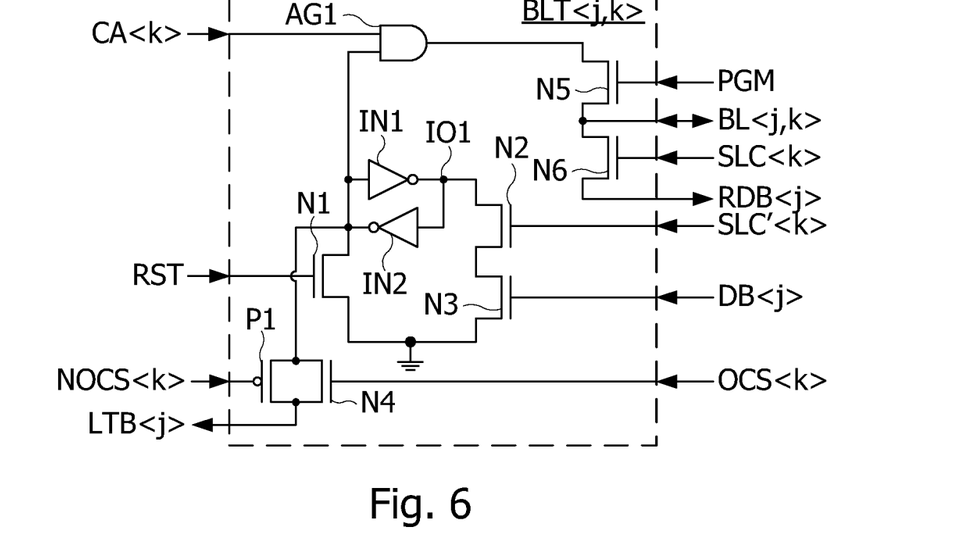

FIG. 6 represents circuits of a bit line latch BLT<j,k>, according to one example of an embodiment. The latch BLT<j,k> comprises two inverters IN1, IN2 mounted head-to-tail and ensuring the actual latch function, an AND-type logic gate AG1, n-channel MOS-type transistors N1 to N6, and a p-channel MOS-type transistor P1. The input of the inverter IN1 and the output of the inverter IN2 are connected to an input of the gate AG1 and to the drain of the transistor N1. The transistor N1 comprises a source terminal linked to the ground and a gate terminal receiving a reset signal RST. The output IO1 of the inverter IN1 and the input of the inverter IN2 are connected to a drain terminal of the transistor N2. The transistor N2 comprises a gate terminal receiving from the latch SLT<k> of the corresponding column k a signal SLC'<k>, and a source terminal connected to a drain terminal of the transistor N3. The transistor N3 comprises a gate terminal connected to a line DB<j> of rank j of the data bus DB, and a source terminal connected to the ground. The output of the inverter IN2 is connected to drain terminals of the transistor P1 and of the transistor N4. The transistors P1 and N4 comprise source terminals connected to a line LTB<j> of rank j of the bus LTB. The transistors N4 and P1 comprise gate terminals respectively receiving the signals OCS<k> and NOCS<k> that are continuously in opposite logic states. Therefore, the voltage supplied to the bus LTB is not decreased by the threshold voltage of one or other of the transistors P1 and N4, and can reach 0 and the supply voltage of the circuit, depending on the state of the bit stored by the latch IN1-IN2.

The gate AG1 comprises another input receiving the signal CA<k>. The output of the gate AG1 is connected to a drain terminal of the transistor N5. The transistor N5 comprises a gate terminal receiving a programming control signal PGM, and a source terminal connected to a drain terminal of the transistor N6 and to the bit line BL<j,k>. The transistor N6 comprises a gate terminal receiving the column select signal SLC<k>, and a source terminal connected to the line RDB<j> of rank j of the read bus RDB.

The switch of the latch IN1-IN2 to the low state is triggered by a pulse supplied by the signal RST during which the transistor N1 is on. In this state, the output IO1 of the inverter IN1 is maintained in the high state and the output of the inverter IN2 is maintained in the low state. The switch of the latch IN1-IN2 to the high state is triggered by the signal SLC'<k> changing to the high state and the signal DB<j> changing to the high state, thus rendering the transistors N2, N3 on. In this state, the output IO1 of the inverter IN1 is maintained in the low state and the output of the inverter IN2 is maintained in the high state.

Figure 7:
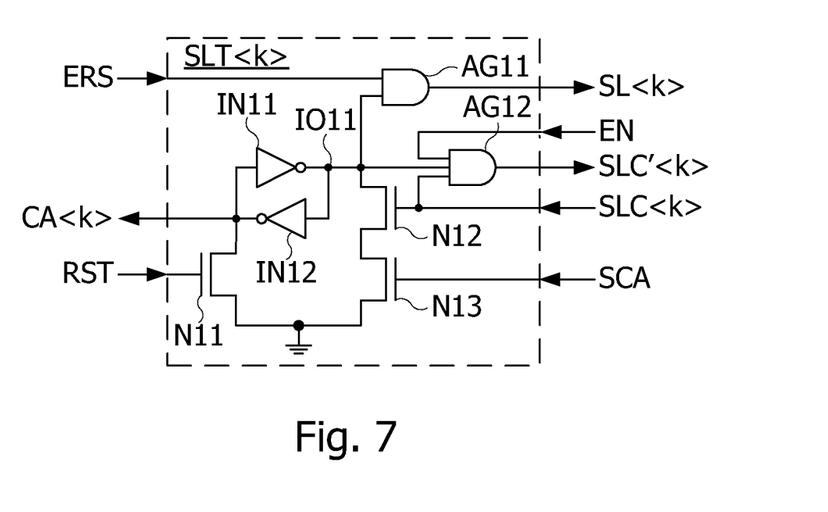

FIG. 7 represents circuits of a source line latch SLT<k>, according to one example of an embodiment. The latch SLT<k> comprises two inverters IN11, IN12 mounted head-to-tail and ensuring the actual latch function, two AND-type logic gates AG11, AG12, and n-channel MOS-type transistors N11 to N13. The input of the inverter IN11 and the output of the inverter IN12 are connected to a drain terminal of the transistor N11. The transistor N11 comprises a source terminal linked to the ground and a gate terminal receiving the reset signal RST. The output IO11 of the inverter IN11 and the input of the inverter IN12 are connected to an input of the gate AG11, to an input of the gate AG12 and to a drain terminal of the transistor N12. Another input of the gate AG11 receives an erase control signal ERS. The output of the gate AG11 is connected to the source line SL<k>. The gate AG12 receives at input the signal SLC<k> and an enable signal EN supplied by the circuit LCT. The output of the gate AG12 supplies the bit line latches BLT<j,k> of the same column k with the signal SLC'<k>. The transistor N12 comprises a gate terminal receiving the column select signal SLC<k>, and a source terminal connected to a drain terminal of the transistor N13. The transistor N13 comprises a gate terminal receiving the signal SCA of the circuit LCT, and a source terminal connected to the ground. The output of the inverter IN12 supplies the bit line latches BLT<j,k> of the same column k with the signal CA<k> at the output of the latch SLT<k>.

Like the latch IN1-IN2 in FIG. 6, the latch IN is in the low state when the output IO11 of the inverter IN11 is in the high state and the output of the inverter IN12 is in the low state. The switch of the latch to the low state is triggered by a pulse supplied by the signal RST. The switch of the latch IN11-IN12 to the high state is triggered when the signals SLC<k> and SCA enable the transistors N12, N13. In this state, the output IO11 of the inverter IN11 is maintained in the low state and the output of the inverter IN12 is maintained in the high state.

According to Table 1, the bit line latches BLT<j,k> and column latches SLT<k> do not have to switch high voltages. The result is that the latches BLT<j,k> may be more compact as they do not need a high voltage component. The few transistors that are added into these circuits compared to classic bit line latches and column latches do not occupy very much integrated circuit surface area.

The signals RST, PGM, EN and ERS are supplied to the latches BLT<j,k> and SLT<k> by the circuit LCT. Before executing phases I to VI, the circuit LCT controls the initialization of all the latches BLT<j,k> and SLT<k> by activating the signal RST. The activation of the signal RST indeed renders the transistors N1 and N11 on, and thus forces the latches IN1-IN2 and IN11-IN12 of the circuits BLT<j,k> and SLT<k> to the low state.

Figure 8A:
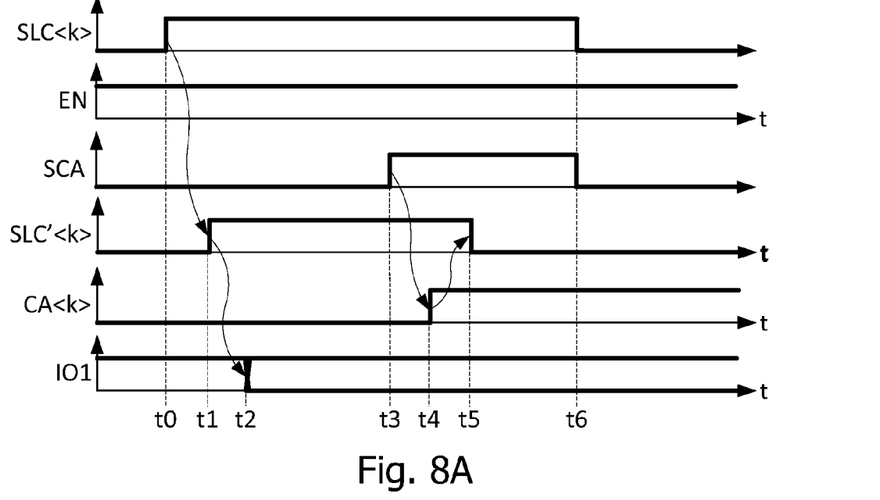
Figure 8B:
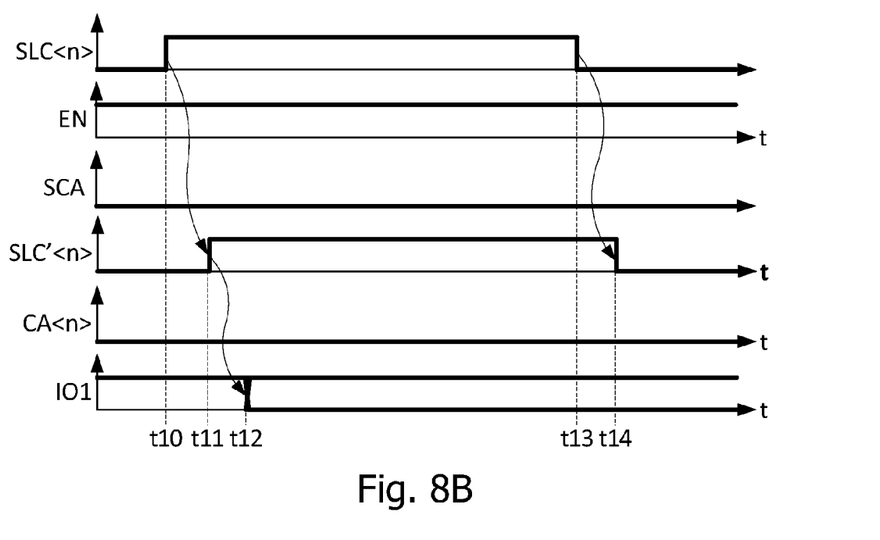
Figure 8C:
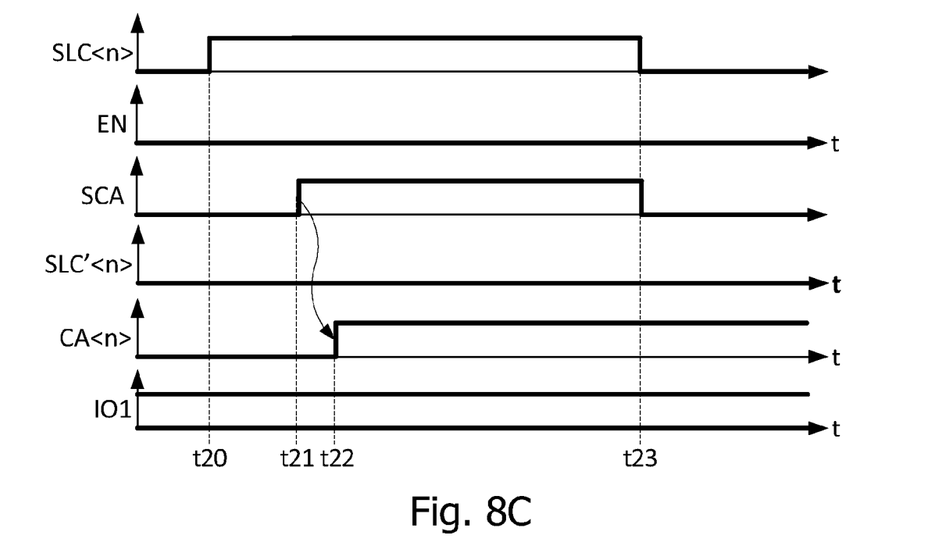

FIGS. 8A to 8C are timing diagrams of the signals SLC<k>, EN, SCA, SLC'<k>, CA<k>, CA<k> and IO1, showing the operation of one of the column latches SLT<k> during phases I, II, III and V (FIG. 1).

FIG. 8A corresponds to phase I. During this phase, a word DT to be written in the memory is sent by the bus DB. The decoding of the write address ADD by the circuit CDEC enables one of the signals SLC<k> enabling the selection of a column k to be activated. During this phase, the signal EN is put to the high state by the circuit LCT. The activation at a time t0 of the signal SLC<k> of the selected column k, triggers the change to the high state of the signal SLC'<k> at a time t1. The transistors N2, N3 of all the latches BLT<j,k> of the column k having a rank j corresponding to a bit in the high state of the word DT on the bus DB (DB<j> in the high state), then become on. The result is that these bit line latches switch to the high state, at a time t2, and the other bit line latches remain in the low state. The latches BLT<j,k> of the column k thus store the value of the word DT. The circuit LCT then activates the signal SCA at a time t3. As the signal SLC<k> is also active for the column k, the transistors N12 and N13 become on, which results in switching the latch IN11-IN12 of the circuit SLT<k> of the column k to the high state, at a time t4. The switch of the latch SLT<k> entails the change to the low state of the signal SLC'<k> at a time t5. At the end of the phase I, at a time t6, the circuit SLT puts the signals SLC<k> and SCA to the low state. The latches SLT<k> and BLT<j,k> of the column k and of ranks j corresponding to a bit in the high state of the word DT are thus in the high state.

It shall be noted that phase I can be executed to load several contiguous words into the word line WL<i>. In this case, the times t0 to t6 occur for each word to be written. Therefore, at the end of phase I, several words can be stored by the latches BLT<j,k>. The latch SLT<k> of each column k comprising a word to be written is thus in the high state.

FIG. 8B corresponds to the processing of each word column n during phase II. At the start of this phase, the circuit LCT activates the signal EN and maintains the signal SCA in the low state. During this phase, the circuit LCT controls the read amplifiers RDA to read memory cells in the normal mode N. The circuit LCT then controls the successive reading of each of the words stored in the word line WL<i> selected by the decoder YDEC according to the address of the word to be read. For this purpose, the signal SLC<n> is successively activated for each column n to select the latter. For each column n, the signal SLC<n> is activated at a time t10. The result is that the signal SLC'<n> only changes to the high state at a time t11 if the latch SLT<n> has not been switched to the high state (during phase I). If the column n is selected by the signal SLC'<n> in the high state, the bits of the word read are transferred from the accessed memory cells to the input DB<j> of the latches BLT<j,n>, through the transistor N6, the bus RDB, the amplifiers RDA and the bus DB. The switch of each latch BLT<j,n> to the high state, at a time t12, depends on the high state of the signal SLC'<n> and of the signal on the line DB<j>. At a time t13, the circuit LCT puts the signal SLC<n> to the low state, which causes the signal SLC'<n> to change to the low state at a time t14. The circuit LCT then triggers these operations for a next column until all the columns of the memory are thus processed. Therefore, the switch of each latch BLT<j,n> to the high state is inhibited in each column in which a word must be written (when the latch SLT<n> of the corresponding column n is in the high state). As above, a bit of rank j, read in the line i and in the column n, in the high state (DB<j>=1) renders the transistor N3 on, the transistor N2 being on if the signal SLC<n> is in the high state (if the signal SLC<n> is in the high state and if the latch SLT<n> is in the low state). The result is that at the end of phase II, all the latches BLT<j,n≠k> store the words present in the memory cells of the line WL<i>, except for the latches BLT<j,k> belonging to the column k of the word to be written, or belonging to the columns of the words to be written.

During phase III shown in FIG. 8C corresponding to the processing of each word column n, the circuit LCT maintains the signal EN in the low state and controls the read amplifiers RDA in order to read memory cells in the erase check mode ER, and maintains the signal EN in the low state. Then the circuit LCT controls the reading of each of the words stored in the word line WL<i> selected by the decoder YDEC according to the address to be written.

Upon each read of the memory cells of a word in a column n, the circuit LCT activates the signals SLC, OCS and NOCS at a time t20, which results in the circuit CDEC activating the signals SLC<n>, OCS<n> and NOCS<n> of the column n. The transistors P1 and N4 then become on, which results in sending the state of each of the latches BLT<j,n> of rank j and of the column n to a line LTB<j> of rank j of the bus LTB. Furthermore, as the signal SLC<n> is in the high state, the transistor N6 is on. The amplifiers RDA are thus linked to the bit lines BL<j,n> of the column n. The comparator CMP then receives by means of the bus LTB the state of the latches BLT<j,n> of the column n, and by means of the bus DB (at output of the amplifiers RDA) the bits of the word stored in the word line WL<i> and in the column n. The comparator CMP supplies the circuit LCT with the signal CS indicating whether the words thus compared, received by the buses LTB and DB, are identical or different. If the words compared are different, the circuit LCT activates the signal SCA at a time t21, which results in switching the latch SLT<n> selected by the signal SLC<n> to the high state, and thus in switching the signal CA<n> to the high state at a time t22. At a time t23, the signal SLC<n> is deactivated to process the next column (time t20). At the end of phase III, when all the columns of the memory are thus processed, all the latches SLT<n> corresponding in the memory to words having bits detected in a poorly erased state, are thus in the high state, to indicate that the corresponding memory cells should be erased and reprogrammed.

According to one alternative embodiment, the circuit LCT may control a systematic read and a comparison for all the columns. As some of the memory cells of each word column to be written may be in states different from the latches BLT<j,k>, the comparison will reveal a difference and will thus lead to a command for switching to the high state the latch of the word column to be written that is already in the high state.

According to another alternative embodiment, the circuit LCT tests the state of the latch SLT<k> of each word column k before controlling the read and the comparison, and goes directly to the next word column if the latch SLT<k> is in the high state.

During phase IV, the circuit LCT activates the signal ERS, which results in applying a zero voltage to the source lines SL<n> of the latches SLT<n> in the high state (output of the gate AG11 in the low state), and the supply voltage (=Vsinh) of the circuit SLT<n> to the source lines SL<n> of the latches SLT<n> in the low state (output of the gate AG11 in the high state). In practice, some of the voltages applied to the memory array must be regulated to well defined fixed values. For this purpose, the circuits of the latches SLT are supplied by a charge pump of the memory that supplies adequate regulated voltages. The circuit LCT also maintains the signals PGM, EN and the signals SLC<k> of all the columns in the low state. The transistors N5, N6 are thus off, which results in maintaining all the bit lines BL<j,k> at a floating potential. The result is that all and only the memory cells of the line WL<i> belonging to a column n the latch SLT of which is in the high state are completely erased. However, the memory cells whose source is linked to a latch SLT<k> in the low state receive the voltage Vsinh on their source and are thus not erased. In reality, the voltage Vsinh is insufficient to ensure that an extraction of a minute quantity of electric charges in the floating gates of the transistors FGT cannot occur.

During phase V also shown in FIG. 8C, the circuit LCT maintains the signal EN in the low state and controls the read amplifiers RDA in order to read memory cells in the program check mode PG, and maintains the signal EN in the low state. Then the circuit LCT controls the successive reading of each of the words stored in the word line WL<i> selected.

Upon each read of a word in a column n, the circuit LCT activates the signals SLC, OCS and NOCS, which results in the circuit CDEC activating the signals SLC<n>, OCS<n> and NOCS<n> at the time t20. The transistors P1 and N4 then become on, which results in sending the state of each of the latches BLT<j,n> of the column n to the bus LTB. Furthermore, as the signal SLC<n> is in the high state, the transistor N6 is on. The amplifiers RDA are thus linked to the bit lines BL<j,n> of the column n. The comparator CMP then receives by means of the bus LTB the state of the latches BLT<j,n> of the column n, and by means of the bus DB (at output of the amplifiers RDA) the bits of the word stored in the word line WL<i> and in the column n. The comparator CMP then supplies the circuit LCT with a signal CS indicating whether the words thus compared are identical or different. If the words compared are different, the circuit LCT activates the signal SCA at the time t21, which results in switching the latch SLT<n> selected by the signal SLC<n> to the high state, and thus in switching the signal CA<n> to the high state at the time t22. At the end of phase V, all the latches SLT<n> corresponding in the memory to words having bits detected in a poorly programmed state, are in the high state.

According to one alternative embodiment, the circuit LCT may control a systematic read and a comparison for all the columns. As the memory cells of each word column k selected by a column latch SLT<k> in the high state may be in states different from the latches BLT<j,k>, the comparison will reveal a difference (signal CS activated) and thus will lead to a command for switching to the high state the latch SLT<k> that is already in the high state.

According to another alternative embodiment, the circuit LCT tests the state of the latch SLT<k> of each word column k before controlling the read and the comparison, and goes directly to the next word column if the latch SLT<k> is in the high state.

During phase VI, the circuit LCT activates the signal PGM, and maintains the signal EN in the low state. The result is that the transistor N5 becomes on. Furthermore, the output of the gate AG1 is in the high state in all the bit line latches BLT<j, n> in the high state of the columns n the signal CA<n> of which is in the high state. It shall be noted that as the signal SLC<k> (and thus the signal SLC'<k>) is inactive for all the columns, the transistor N6 remains off in all the latches BLT<j,k>. The bit lines BL<j,n> receive through the transistor N5 either a zero voltage for the bit lines connected to a latch BLT<j,n> in the low state and not belonging to a column n the signal CA<n> of which is in the high state, or a voltage equal to the voltage Vd1, for the bit lines connected to a latch BLT<j,n> in the high state and belonging to a column n selected by the activation of the signal CA<n>. For this purpose, the voltage Vd1 can be supplied as a supply voltage to the latches BLT<j,k>.

The memory cells of the accessed line WL<i>, detected as poorly erased or poorly programmed are thus erased and/or programmed. In addition, only these memory cells with those that are to receive the words DT to be written are erase- and program-accessed.

In the event that a latch SLT<n> must be switched to the high state further to a comparison revealing a poorly erased or poorly programmed cell, the signal EN is maintained in the low state. As a result, the signal SLC'<n> remains in the low state. The result is that a bit line latch BLT<j,n> cannot switch to the high state between the times t3 and t5, given that a datum read may be present on the bus DB at that time.

Figure 9:
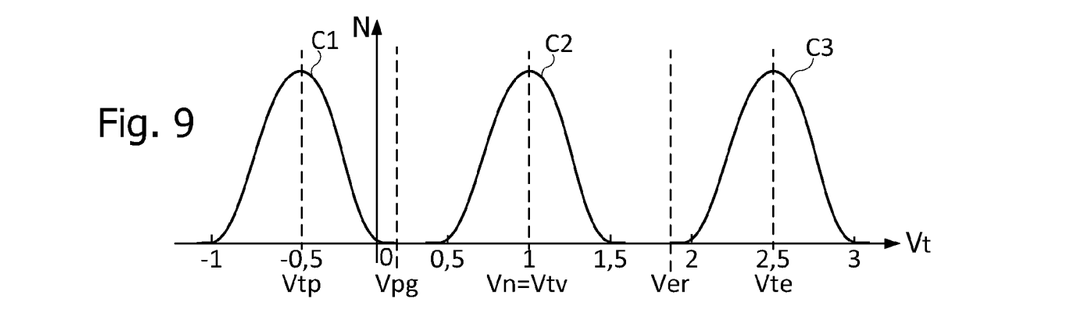
FIG. 9 represents curves of the variation in a number of memory cells, respectively in the programmed, blank and erased state, according to the threshold voltage of the floating-gate transistor of the memory cells.

FIG. 9 represents curves C1, C2, C3 of variation of a number N of memory cells, respectively in the programmed, blank and erased state, according to the threshold voltage Vt of their floating-gate transistor FGT. The curves C1, C2, C3 have the shape of Gauss curves centered on threshold voltages Vtp for the memory cells in the programmed state, Vtv for the memory cells in the blank state and Vte for the memory cells in the erased state. In the example in FIG. 9, Vtp is equal to −0.5V, Vtv is equal to 1V and Vte is equal to 2.5V. The normal read voltage Vn (=Vrd) applied by the decoder YDEC to the control gate of a transistor FGT of a cell to be read (at the line CGL<i>), may be chosen equal to or in the vicinity of the voltage Vtv.

According to one embodiment, the program PG and erase ER check read modes RDM are defined by adjusting the control gate voltage CGL<i> applied to the transistors FGT to a read voltage Vpg for the program check mode PG and to a read voltage Ver for the erase check mode ER. The selection of a read mode RDM is controlled by the circuit LCT by adjusting the supply voltage of the decoder YDEC supplied by a charge pump of the memory.

According to one embodiment, the voltage Vpg is set to an intermediate value between the voltages Vtp and Vn, to a value as small as possible corresponding to a zero number N of transistors FGT on the curve C1. In other words, the voltage Vpg is chosen so that 100% of the correctly programmed memory cells are detected as such in relation to the Gauss distribution of the curve C1. Therefore, this avoids memory cells being detected as poorly programmed and being programmed upon each test performed during phase V. In the example in FIG. 9, the voltage Vpg is chosen equal to 0.2V. According to one embodiment, the read voltage Ver for the erase check mode ER is set to an intermediate value between the voltages Vn and Vte, to a value as high as possible corresponding to a zero number N of transistors FGT on the curve C3. In other words, the voltage Ver is chosen so that 100% of the correctly erased memory cells are detected as such in relation to the Gauss distribution of the curve C3. This thus avoids memory cells being detected as poorly erased and being erased upon each test performed during phase III. In the example in FIG. 9, the voltage Ver is chosen equal to 1.8V.

According to another embodiment, the selection of a read mode RDM is controlled by the circuit LCT by adjusting a read current supplied by the read amplifiers RDA. Thus, the read current in the erase check mode ER can be set to a value lower than the read current in the normal read mode N, and the read current in the program check mode PG can be set to a value greater than the read current in the normal mode N. For example, if the read current in the normal mode is on 2 μA, the read current in the ER and PG modes can be respectively set to approximately 1 μA and approximately 3 μA.

It will be understood by those skilled in the art that the present disclosure is susceptible of various alternative embodiments and various applications. In particular, the present disclosure is not limited to memories corresponding to the architecture in FIG. 2, but can apply to other memory architectures based on floating-gate transistors in which the control voltages can be decreased by refreshing the state of some memory cells. By integrating memory cell refresh operations into a write cycle, at least some embodiments of the present disclosure enable to decrease the control voltages implemented in particular when erasing and programming memory cells. Therefore, the different control voltages of the memory, supplied previously, are specific to the memory architecture presented, and thus have been presented as an example only. These control voltages can easily be adapted to another memory architecture while remaining in the framework of the present disclosure. The present disclosure applies more generally to EEPROM memories having an erase-granularity lower than or equal to one word line or page.

The voltages applied to the memory cells of the memory during erasing and programming do not necessarily lead to both a progressive erasing of the programmed memory cells of the word line and to a progressive programming of the erased memory cells of the word line. Therefore, only an erase- or program-refresh may be sufficient. In addition, one embodiment of the present disclosure operates solely on the erasing of one or more words in a word line of the memory, and such an erasing may employ a program-refresh of the other memory cells of the same word line, or may be used to perform an erase-refresh of these other memory cells.

In addition, the operations of checking the erased and programmed state of the memory cells of the page to which the input data word is intended to be written do not necessarily concern an entire word page or line, but may concern only a fraction of the page, for example half of the page. The operations of checking the erased and programmed states of the memory cells of the page can also be performed in any order. For erasing, the operation of checking the erased state should be performed before the erase operation. For programming, the operation of checking the programmed state should be performed before the programming operation. Also, the erase operation should be performed before the programming operation.

Furthermore, means other than bit line latches may be implemented to store bits stored in a selected word line and bits of a data word to be written. Similarly, other means may be implemented to select hardware words of the selected word line to be programmed and possibly to be erased. These means may for example comprise register cells.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, the method comprising:
receiving a write command indicating a datum to be written and a write address for writing in an EEPROM memory,
storing in first memory units the datum to be written,
selecting a first hardware word to be modified, formed by first memory cells belonging to a word line and a word column of the memory, corresponding to the write address, the word column including several first bit lines transversal to the word line and connected to the first memory cells,
erasing the first memory cells forming the first hardware word,
storing in second memory units bits read according to a first read mode from second memory cells of the word line, linked to second bit lines, distinct from the first bit lines,
reading in a second read mode bits stored in the second memory cells,
selecting at least one second hardware word that includes the second memory cells and stores at least one bit having different states in the first and second read modes, and programming each of the first memory cells corresponding to a programmed bit in the first memory unit and each of the second memory cells belonging to the at least one second hardware word and corresponding to a programmed bit in the second memory unit.

2. The method according to claim 1, wherein:
the second read mode is a mode for checking an erased state of the second memory cells of the memory;
the word line includes a plurality of memory cells including the first and second memory cells; and
erasing the first hardware word includes erasing all the memory cells of the word line before programming the first and second memory cells.

3. The method according to claim 1, wherein the second read mode is a mode for checking a programmed state of the second memory cells.

4. The method according to claim 3, comprising:
reading the bits stored in the second memory cells of the word line, in a third read mode to check an erased state of the memory cells,
selecting at least one third hardware word that includes the second memory cells and includes at least one bit having different states in the first and third read modes, and
erasing all the memory cells of the at least one third hardware word selected in the word line, at the same time as the first hardware word, and before programming the first and second memory cells.

5. The method according to claim 4, wherein:
reading in the first read mode includes applying a normal read voltage to a control gate line of the word line, the control gate line being connected to gates of floating-gate transistors of memory cells belonging to the word line;
reading in the second read mode includes applying an erase check voltage, greater than the normal read voltage, to the control gate line; and
reading in the third read mode includes applying a program check voltage, lower than the normal read voltage, to the control gate line.

6. The method according to claim 4, wherein:
reading in the first read includes applying a normal read current to the bit lines connected to the second memory cells;
reading in the second read mode includes applying an erase check current, lower than the normal read current, to the bit lines connected to the second memory cells; and
reading in the third read mode includes applying a program check current, greater than the normal read current, to the bit lines connected to the second memory cells.

7. The method according to claim 1, wherein the second memory cells comprise all the memory cells of the word line not belonging to the first hardware word.

8. The method according to claim 1, wherein the memory cells of the memory include floating-gate transistors, respectively, and each floating-gate transistor includes a gate, a source, and a drain, the method comprising erasing the memory cells of the at least one second hardware word of the word line, wherein erasing the memory cells of the at least one second hardware word includes:
subjecting the gates of the floating-gate transistors of the at least one second hardware word to a positive high voltage,
subjecting the sources of the floating-gate transistors of word columns including the at least one second hardware word to a zero voltage, and
subjecting the sources of the floating-gate transistors of each word column of the memory not including any memory cells of the at least one second hardware word to a positive erase-inhibit low voltage.

9. The method according to claim 8, wherein the erase-inhibit voltage is set at an insufficient value to prevent any progressive erasing, over several erase cycles, of any programmed memory cells belonging to the word line and each word column not including any memory cells of the at least one second hardware word.

10. The method according to claim 1, wherein:
the memory cells of the memory include floating-gate transistors, respectively, and each floating-gate transistor includes a gate, a source, and a drain; and
the programming includes subjecting the gates of the floating-gate transistors of the word line to a negative high voltage and subjecting to a low voltage the drains of the floating-gate transistors of the first memory cells corresponding to a programmed bit in the first memory unit and each of the second memory cells belonging to the at least one second hardware word and corresponding to a programmed bit in the second memory unit.

11. The method according to claim 10, wherein for each of the floating-gate transistors of the memory cells not to be programmed and belonging to the word line, subjecting the drain of the floating-gate transistor to a voltage such that a difference in voltage in absolute value between the drain and the gate of the floating-gate transistor is sufficiently high to prevent any progressive programming, over several program cycles, of the memory cells in an erased state belonging to the word line and not to be programmed.

12. The method according to claim 1, wherein the datum to be written has a size that corresponds to plural hardware words of the memory.

13. An EEPROM memory, comprising:
a memory array of memory cells arranged in a plurality of word lines and a plurality of word columns transverse to the word lines, each word column include a number of bit lines, and the word lines and word columns intersecting each other at respective hardware words that each include a plurality of memory cells equal to the number of bit lines;
first memory units and second memory units; and
row and column decoders configured to:
receive a write address of a write command that includes a datum to be written in the memory array,
store in the first memory units the datum to be written,
select, from the hardware words of the memory, a first hardware word to be modified, corresponding to the write address, the first hardware word including first memory cells, the first memory cells being of a first word line of the word lines of the memory and of a first word column of the word columns of the memory,
erase the first memory cells,
store in the second memory units bits read according to a first read mode from second memory cells of the first word line, the second memory cells being memory cells of hardware words of the first word line other than the first hardware word,
read in a second read mode bits stored in the second memory cells,
select at least one second hardware word that includes the second memory cells and stores at least one bit having different states in the first and second read modes, and
program each of the first memory cells corresponding to a programmed bit in the first memory unit and each of the second memory cells belonging to the at least one second hardware word and corresponding to a programmed bit in the second memory unit.

14. A memory according to claim 13, wherein the memory cells each include a floating-gate transistor and a select transistor coupled in series with the floating-gate transistor, each word line including a select line coupled to a gate terminal of each of the select transistors of the word line, and a control gate line coupled to a gate terminal of each of the floating-gate transistors of the word line, each word column including a control source line coupled to a source terminal of each of the floating-gate transistors of the memory cells of the word column.

15. A memory according to claim 13, wherein each memory unit of the first and second memory units includes a bit line latch including a two-state circuit, each bit line latch being coupled to a respective one of the bit lines of the memory array.

16. A memory according to claim 13, comprising a plurality of source line latches respectively coupled to the control source lines of the word columns, each source line latch including a two-state circuit configured to store an indication of whether a word of the word column, to which the source line latch is coupled, is selected.

\* \* \* \* \*